United States Patent
Gallegos et al.

(10) Patent No.: US 9,054,092 B2
(45) Date of Patent: Jun. 9, 2015

(54) METHOD AND APPARATUS FOR STOPPING RESIN BLEED AND MOLD FLASH ON INTEGRATED CIRCUIT LEAD FINISHES

(71) Applicant: TEXAS INSTRUMENTS INCORPORATED, Dallas, TX (US)

(72) Inventors: Bernardo Gallegos, McKinney, TX (US); Yong Lin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/064,671

(22) Filed: Oct. 28, 2013

(65) Prior Publication Data

US 2015/0115421 A1 Apr. 30, 2015

(51) Int. Cl.
*H01L 23/48* (2006.01)
*H01L 23/495* (2006.01)

(52) U.S. Cl.
CPC ..... *H01L 23/49558* (2013.01); *H01L 23/49541* (2013.01); *H01L 23/49548* (2013.01)

(58) Field of Classification Search
CPC ............... H01L 23/49541; H01L 23/49548; H01L 23/49558
USPC ............... 438/112; 257/692, 735, E23.043, 257/E23.046, E23.05, E23.066
See application file for complete search history.

(56) References Cited

U.S. PATENT DOCUMENTS

| | | | |
|---|---|---|---|
| 5,070,039 A | 12/1991 | Johnson et al. | |
| 5,271,148 A | 12/1993 | Desrochers et al. | |
| 5,789,806 A | 8/1998 | Chua et al. | |
| 6,127,206 A * | 10/2000 | Nakamichi | 438/111 |
| 7,183,657 B2 | 2/2007 | Furtaw et al. | |
| 7,598,119 B2 | 10/2009 | Martinez et al. | |
| 8,252,615 B2 | 8/2012 | Jang et al. | |
| 2004/0238923 A1 * | 12/2004 | Lee et al. | 257/670 |
| 2006/0071307 A1 * | 4/2006 | Shirasaka et al. | 257/666 |
| 2008/0185698 A1 * | 8/2008 | Tseng et al. | 257/676 |

* cited by examiner

*Primary Examiner* — Kimberly Rizkallah
*Assistant Examiner* — Maria Ligai
(74) *Attorney, Agent, or Firm* — Steven A. Shaw; Frank D. Cimino

(57) ABSTRACT

A method and apparatus of minimizing resin bleed and mold flash on integrated lead finishes by providing groves on the external leads that can control the length of resin bleed.

12 Claims, 3 Drawing Sheets

FIG. 2
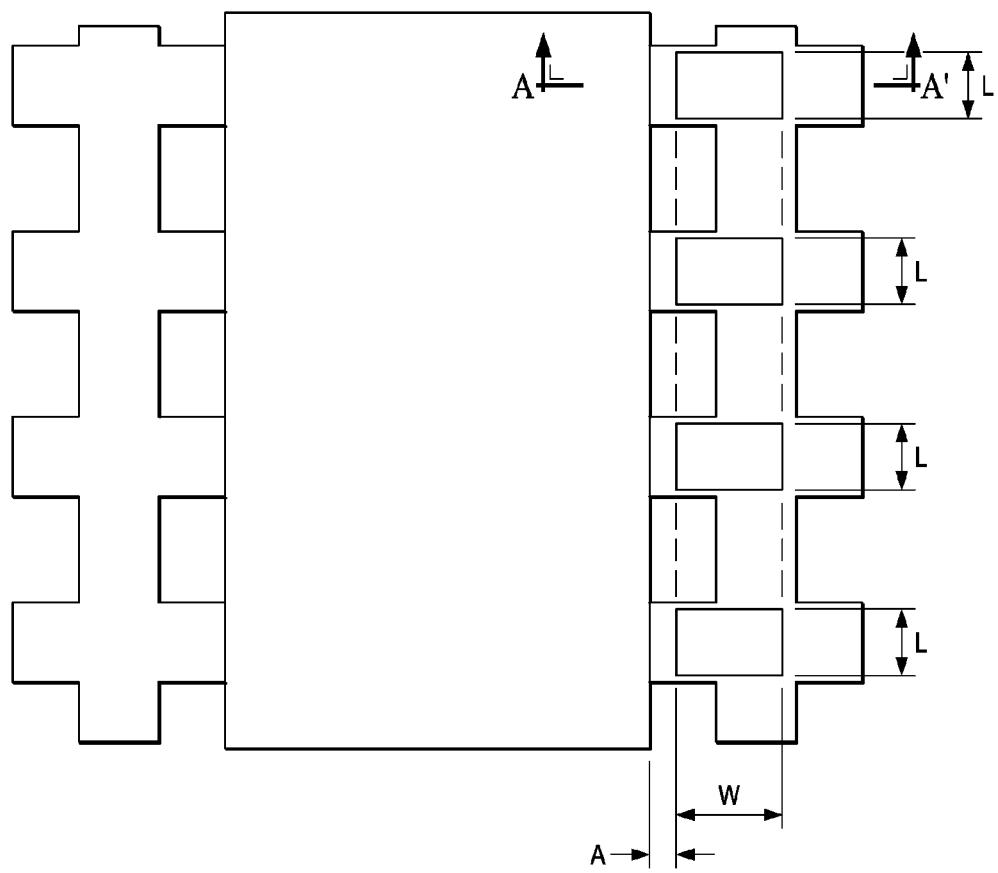
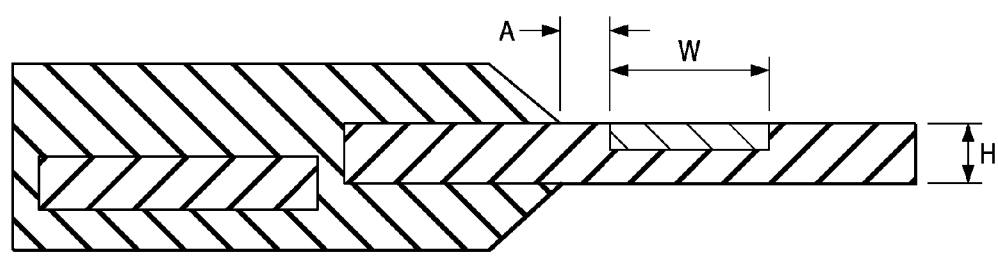
FIG. 3

| # | OPTION | DRAWING | PROCESS | | | |
|---|---|---|---|---|---|---|
| | | | STAMPING | COINING | ETCHING | LASER MILLING |
| 1 | RECTANGULAR SHAPE | | X | X | X | X |
| 2 | ROUND SHAPE 1 | | X | X | X | X |
| 3 | ROUND SHAPE 2 | | X | | X | X |
| 4 | TRIANGULAR SHAPE 1 | | X | | | X |
| 5 | TRIANGULAR SHAPE 2 | | X | | | X |
| 6 | "V" SHAPE | | X | | | X |
| 7 | "W" SHAPE | | X | | | X |
| 8 | COINING | | | X | | X |

…

METHOD AND APPARATUS FOR STOPPING RESIN BLEED AND MOLD FLASH ON INTEGRATED CIRCUIT LEAD FINISHES

FIELD OF THE INVENTION

The present invention relates generally to semiconductor devices, and more particularly to a method and apparatus for controlling bleeding of molding resin on the leads.

BACKGROUND OF THE INVENTION

This invention relates to the assembling and packaging of integrated circuit devices and, more particularly, to provide a lead frame for such devices for stopping resin bleed and mold flash on Integrated Circuit lead finishes.

Integrated circuits in the form of semiconductor dies are first attached to a support pad of the lead frame. Contact or bond pads on the semiconductor device are then individually attached by wire bonding to corresponding contact pads on the ends of the leads.

After the wire bonding operation is completed, the lead frame is placed in a mold. The mold is provided from a reservoir with a quantity of insulating, molding compound. The molding compound is injected into the mold in order to encapsulate the circuit.

It is found useful by those skilled in the art to form the lead frames in a continuous strip. Each lead frame strip has an integrated circuit device attached to support pad as mentioned above. The support pads are themselves supported by two parallel siderails. Each siderail is located in the plane of the lead frame and on opposite sides of the die pad.

In the molding operation, mold cavities are formed around the lead frames to tightly close and seal upon themselves as well as the dam bar. The dam bar has a transverse portion that extends between pairs of adjoining leads. The dam bar restricts the flow of encapsulation material from the enclosed lead frame. After encapsulation, the dam bar and a portion of the mold flashing projecting between adjoining leads is removed by a punch. The punch is the typical metal punch that readily severs the metallic dam bar and also removes a portion of the projected mold flashing from between the leads of the lead frame.

During the molding operation, some excess resin can end up coating part of the lead. This resin could affect the formation of the lead's solder profile and electrical conductivity when soldering to the board. The excess resin is referred to as "resin-bleed". The resin-bleed can appear as clear and called "clear-bleed" or as visible residue that often referred to as "mold-flash". Chemical deflashing and media deflashing methods are commonly used in the industry to remove this excess resin on the leads.

As such, there has arisen a need for an improved lead frame for producing an encapsulated integrated circuit that has leads with limited mold flash or resin-bleed without the need for mold flash and resin-bleed removal.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, a molded semiconductor package is provided. The molded semiconductor package comprises: a molded semiconductor package, having an edge to the molded portion of the package, a leadframe having a top and bottom surface and a thickness therebetween, a plurality of leads, and a dam bar separated from the package edge, comprising: at least one pair of adjoining leads and a dam bar having a transverse portion extending between the adjoining leads; a first barrier in the form of a groove formed over the top surface of each of the at least one pair of adjoining leads, wherein the first barrier generally is separated by a space between the package edge, the first barrier extending to the outward portion of the dam bar, wherein the first barrier is configured to prevent one or more of the plurality of components associated with the molding compound from bleeding onto surface of the exterior region of the leads.

In accordance with an embodiment of the present application, an integrated circuit in a molded package is provided. The integrated circuit in a molded package comprises: an integrated circuit in a molded package, having an edge to the molded portion of the package, a leadframe having a top and bottom surface and a thickness therebetween, leads, and a dam bar separated from the package edge, comprising: at least one pair of adjoining leads and a dam bar having a transverse portion extending between the adjoining leads; a first barrier in the form of a groove formed over the top surface of the dam bar and at least one pair of adjoining leads, wherein the first barrier generally is separated by a space between the package edge and the outward portion of the dam bar and the exterior region of the leadframe, wherein the first barrier is configured to prevent one or more of the plurality of components associated with the molding compound from bleeding onto surface of the exterior region of the leads.

DESCRIPTION OF THE VIEWS OF THE DRAWING

FIG. 2 is a top view of an exemplary package detailing the groove area when the grooves are created on each lead individually.

FIG. 3 is a cross section through the package in FIGS. 1 and 2 at A:A', highlighting the groove area.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

Figure 1:
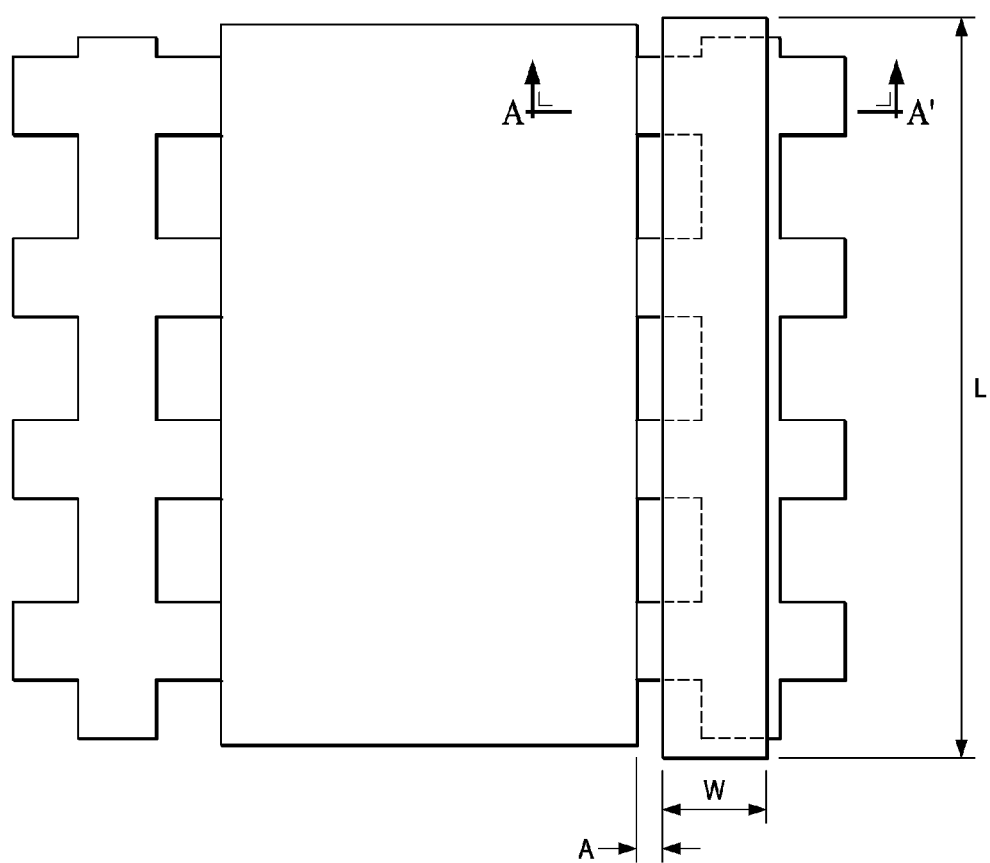
FIG. 1 is a top view of an exemplary package detailing the groove area when the grooves are created across all leads at the same time.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

There is always a need to improve reliability performance of integrated circuit packages, and rough lead frame (LF) technology that allows improved reliability performance. This technology is effective in improving delamination performance under stress, but it presents some manufacturing challenges during assembly. The main challenge addressed by this invention is that due to the nature of the rough LF, the resin from mold compound that is used in packaging is composed of a plurality of components which tend to bleed outside the mold area during the molding process, and in some cases travel all the way beyond the second bend of the lead, which can produce two types of issues: Solderability issues during SMT at customer side, and vision recognition during SMT process due to the darker appearance of the lead when resin bleed is present. The focus of this invention is to minimize the resin bleed effect to avoid the issues mentioned.

This invention relates to a design of grooves on the external leads of a rough lead frame that can control the length of resin bleed onto the leads. The excess resin is referred to as "resin-bleed". The resin-bleed can appear as clear material and is called "clear-bleed" or as opaque residue that is often referred to as "mold-flash".

Chemical deflashing and media deflashing processes are commonly used to remove the resin on the lead surface. The solution provided in this invention does not require this additional process of deflashing because the resin will be stopped by the method and apparatus disclosed and could represent cost avoidance for Assembly/Test (A/T) operations.

The groove area can be made during the laser milling, stamping, coining or etching process of the lead frame. Laser Milling is a process where metal is removed from the lead frame using a laser. Stamping is a process where the lead frame is formed using a set of dies and a punch press. Coining is a process where the lead fingers of the lead frame are flatten out for the purpose of wire bond. It is feasible to add an additional step of coining on the external leads. Etching is a chemical process that etches away the metal by chemical solution.

FIG. 1. shows a molded semiconductor package; the molded portion of the package having an edge, a leadframe having a top and a bottom surface and a thickness therebetween, a plurality of leads, and a dam bar separating the leads and separated from the package edge. The package also has at least one pair of adjoining leads from the plurality of leads and a dam bar having a transverse portion extending between the adjoining leads.

A first barrier in the form of a groove is formed over the top surface of the dam bar and at least one pair of adjoining leads in the first option as shown in FIG. 1 or over the surface of each of at least one pair of adjoining leads as shown in FIG. 2, wherein the first barrier is separated from the molded portion of the package by a space between the package edge. The first barrier can further extend to the outward portion of the dam bar or even overlap the dam bar. The first barrier is configured to prevent one or more of the plurality of components associated with the molding compound from bleeding onto surface of the exterior region of the leads.

The shaded areas in FIG. 3 and outlined in FIGS. 1 and 2 show exemplary dimensions of the groove area. "W" on FIGS. 1, 2 and 3 show the width of the groove area which can be 200 micrometers (um). "L" on FIGS. 1 and 3 show the length of the groove area when the groove is created across all leads and the dam bar. "L" on FIGS. 2 and 3 show the length of the groove area when the groove is created on each lead individually. The length "L" of FIG. 2 can be the same width as the lead or slightly narrower. "H" on FIG. 3 shows the height of the groove area which can be one eighth the thickness of the lead and "A" on FIGS. 1, 2 and 3 show the offset distance of the groove area from the edge of the molded area which can be 100 um. The dimensions listed above can vary depending on the type of package being used such as SOIC, QFP, TSSOP or others.

Figures 4, 5:
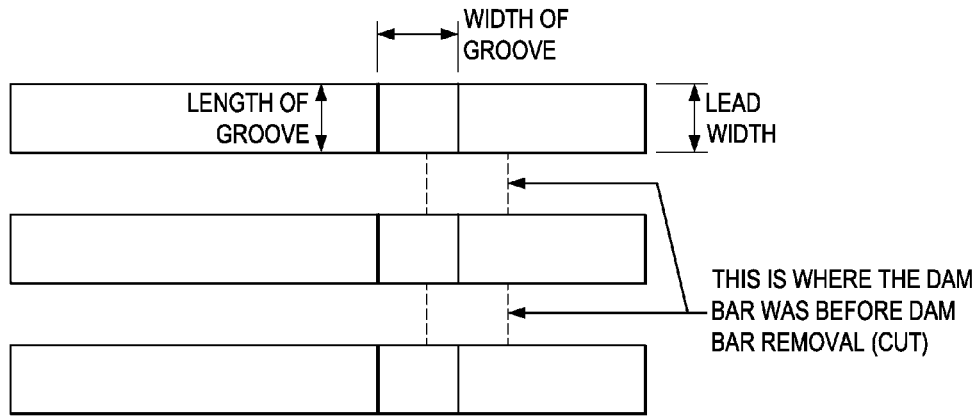
FIG. 4 is a top view of an exemplary set of package leads where the DAM bar has been removed from between the leads.
FIG. 5 is a plan view of groove options.

FIG. 4 shows an exemplary set of leads containing grooves after the dam bar has been removed from the molded package.

FIG. 5 shows a list of possible grooves that can be implemented by the present invention. It also lists the processes by which the grooves can be made such as stamping, coining and etching as they are associated with each type of groove. The list is exemplary and is not a complete list of all possible groove patterns.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A molded semiconductor package, having an edge to the molded portion of the package, a leadframe having top and bottom surfaces and a thickness therebetween, a plurality of leads, and a dam bar separated from the package edge, comprising:
   at least one pair of adjoining leads and a dam bar having a transverse portion extending between the adjoining leads; and
   a first barrier in the form of a groove formed over the top surface of each of the at least one pair of adjoining leads, wherein the first barrier is separated by a space from the package edge, the first barrier extending to the outward portion of the dam bar, wherein the first barrier is configured to prevent one or more of the plurality of components associated with the molding compound from bleeding onto surface of the exterior region of the leads.

2. The molded semiconductor package of claim 1, wherein the space between the first barrier and the package edge is 100 micrometers (um).

3. The molded semiconductor package of claim 1, wherein the shape of the groove is selected from the list of a rectangular shape, a round shape 1, a round shape 2, a triangular shape 1, a triangular shape 2, a "V" shape, a "W" shape and a rough surface formed by either laser milling or coining.

4. The molded semiconductor package of claim 1, wherein the grooves in the rectangular shape and the round shape 1 are formed by either laser milling, stamping, coining or etching.

5. The molded semiconductor package of claim 1, wherein the groove in the round shape 2 is formed by either laser milling, stamping or etching.

6. The molded semiconductor package of claim 1, wherein the grooves in the triangular shape 1, the triangular shape 2, the "V" shape and the "W" shape are formed by either laser milling or stamping.

7. An integrated circuit in a molded package, having an edge to the molded portion of the package, a leadframe having a top and bottom surface and a thickness therebetween, leads, and a dam bar separated from the package edge, comprising:
- at least one pair of adjoining leads and a dam bar having a transverse portion extending between the adjoining leads;
- a first barrier in the form of a groove formed over the top surface of the dam bar and at least one pair of adjoining leads, wherein the first barrier is separated by a space from the package edge and the outward portion of the dam bar and the exterior region of the leadframe, wherein the first barrier is configured to prevent one or more of the plurality of components associated with the molding compound from bleeding onto surface of the exterior region of the leads.

8. The integrated circuit in a molded package of claim 7, wherein the space between the first barrier and the package edge is 100 micrometers (um).

9. The integrated circuit in a molded package of claim 7, wherein the shape of the groove is selected from the list of a rectangular shape, a round shape 1, a round shape 2, a triangular shape 1, a triangular shape 2, a "V" shape, a "W" shape and a shape formed by either laser milling or coining.

10. The integrated circuit in a molded package of claim 7, wherein the grooves in the rectangular shape and the round shape 1 are formed by either laser milling, stamping, coining or etching.

11. The integrated circuit in a molded package of claim 7, wherein the groove in the round shape 2 is formed by either laser milling, stamping or etching.

12. The integrated circuit in a molded package of claim 7, wherein the grooves in the triangular shape 1, the triangular shape 2, the "V" shape and the "W" shape are formed by either laser milling or stamping.

* * * * *